United States Patent [19]
Figura et al.

[11] Patent Number: 5,750,441
[45] Date of Patent: May 12, 1998

[54] MASK HAVING A TAPERED PROFILE USED DURING THE FORMATION OF A SEMICONDUCTOR DEVICE

[75] Inventors: Thomas A. Figura; Bradley J. Howard, both of Boise, Id.

[73] Assignee: Micron Technology, Inc., Boise, Id.

[21] Appl. No.: 650,723

[22] Filed: May 20, 1996

[51] Int. Cl.$^6$ ................................................. H01L 21/02
[52] U.S. Cl. .................... 438/751; 430/312; 430/313; 438/713; 438/736; 438/738; 438/743; 438/744
[58] Field of Search ............................ 156/661.11, 644.1, 156/652.1, 659.11; 437/947, 981, 228; 430/312, 313, 5

[56] References Cited

U.S. PATENT DOCUMENTS

| | | | |
|---|---|---|---|
| 4,269,654 | 5/1981 | Deckert et al. | 156/657 |
| 4,532,005 | 7/1985 | Grieco et al. | 156/661.1 |
| 4,615,782 | 10/1986 | Namatsu et al. | 204/192.36 |
| 4,699,870 | 10/1987 | Iwadate et al. | 430/296 |
| 4,758,305 | 7/1988 | Bonifield et al. | 156/643 |
| 4,806,199 | 2/1989 | Gualandris | 156/643 |
| 4,814,041 | 3/1989 | Auda | 156/643 |

OTHER PUBLICATIONS

S. Wolf and R.N. Tauber, "Silicon Processing for the VLSI Era: vol. 1—Process Technology" (Lattice Press, Sunset Beach, California, 1986), pp. 423, 424.

J.M. Moran and d. Maydan, J. Vac. Sci. Technol., 16, 1620 (1979).

M.A. Hartney, D.W. Hess and D.S. Soan, J. Vac. Sci. Technol., B&, 1 (1989).

O. Joubert, M. Pons, A. Weill and P. Paniex, J. Electrochem. Soc., 140(3) L46 (1993).

F. Watanabe and Y. Ohnishi, J. Vac. Sci. Technol., B4, 422 (1986).

M.A. Hartney, A.E. Novembre and F.S. Bates, J. Vac. Sci. Technol., B3, 1346 (1985).

M.W. Horn, M.A. Hartney and R.R. Kunz, Optical Engineering, 32 (10), 2388 (1993).

Y.-S. Seol et al, Materials Chemistry and Physics, 35, 134 (1993).

O. Joubert et al, SPIE, vol. 1803, 130 (1992).

M. Pons et al. Jpn. J. Appl. Phys. part 1, 33 (2) 991 (1994).

K.T. Sung, W.H. Juan, S.W. Pang and M.W. Horn, J. Electrochem. Soc., 140 (12), 3620 (1993).

*Primary Examiner*—R. Bruce Breneman

[57] ABSTRACT

A method and apparatus for improving the accuracy of a contact to an underlying layer comprises the steps of forming a first photoresist layer over the underlying layer, forming a mask layer over the first photoresist layer, then forming a patterned second photoresist layer over the mask layer. The mask layer is patterned using the second photoresist layer as a pattern then the first photoresist layer is patterned using the mask layer as a pattern. A tapered hole is formed in the first photoresist layer, for example using an anisotropic etch. The tapered hole has a bottom proximate the underlying layer and a top distal the underlying layer with the top of the hole being wider than the bottom of the hole.

20 Claims, 2 Drawing Sheets

MASK HAVING A TAPERED PROFILE USED DURING THE FORMATION OF A SEMICONDUCTOR DEVICE

FIELD OF THE INVENTION

This invention relates to the field of semiconductor manufacture, and more particularly to a method and apparatus for forming an opening such as a contact.

BACKGROUND OF THE INVENTION

During the manufacture of a semiconductor device a large number of transistors and other structures are formed over a semiconductor substrate assembly such as a semiconductor wafer. As manufacturing techniques improve and transistor density increases as feature size decreases, one manufacturing step which can create difficulties is photolithography.

A typical photolithography step using positive resist includes the formation of an opening such as a contact to a wafer substrate. To form a contact, a positive photoresist layer is formed over the substrate assembly and the photoresist is exposed in the area where the contact opening is to be formed. The exposed photoresist is removed to expose various underlying layers, then the underlying layers are removed to expose the wafer substrate to which contact is to be made. The opening is typically formed between two structures such as between two adjacent transistor gates. As device density increases the distance between the gates decreases to allow for more transistors per unit area. This distance can decrease only to the limit allowed by photolithography technology, for example allowing for misalignment of the mask or reticle. Photolithography technology is further limited with regard to the minimum size of an opening it can create in the photoresist. Conventional single-layer lithography is capable of resolving line widths less than 0.5 microns on planar, nonreflective substrates. However, when a conventional single layer lithographic technique is used over reflective topography, thickness deviations in the resist lead to poor line width control, and reflections from topographic sidewalls can cause notching. To defeat these problems, dry develop techniques using multiple layers and/or top surface imaging methods have been developed.

Multilayer lithography techniques include a tri-layer patterning scheme. In this process a thick planarizing layer of novolac resin or some other carbon-based polymer is spun onto the substrate assembly and then baked. Next, an intermediate layer which is resistant to attack in an oxygen plasma (spin-on glass, polysiloxanes, aluminum, silicon nitride, and silicon dioxide, for example) is deposited onto the planarizing layer. A thin layer of resist is applied on top of the intermediate layer to function as an initial imaging layer. The imaging layer is used as a mask to transfer the pattern onto the intermediate layer. Once the pattern is transferred onto the intermediate layer, the intermediate layer is used as the mask for transferring the pattern onto the planarizing layer by way of an oxygen-based plasma. A goal of this process is to form vertical sidewalls such that the opening in the resist is the same at the top as at the bottom.

A process which extends the useful life of current photolithography equipment and allows for forming smaller, more accurate contacts to an underlying layer would be desirable.

SUMMARY OF THE INVENTION

The present invention provides a new method and apparatus for increasing the accuracy of a contact. One embodiment of the invention comprises the use of a first sloped masking layer which can be a layer of photoresist. The masking layer tapers from top to bottom, being wider at the top, and allows for increased misalignment of a second mask which is used to form the taper in the first mask.

Using a preferred embodiment, the sloped masking layer is formed by providing a first masking layer such as photoresist over a substrate assembly, then providing a second masking layer over the first layer which can withstand an etch of the first layer. A third patterned masking layer is provided over the second masking layer, and the second layer is patterned. The first layer is then patterned using the second masking layer as a pattern.

Various objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE PREFERRED EMBODIMENTS

Figure 1:
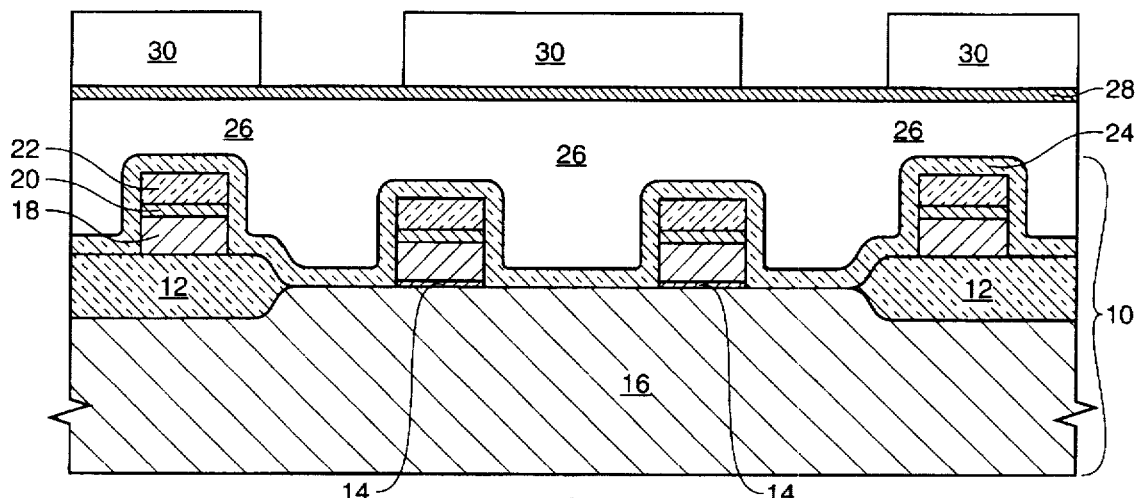
FIG. 1 depicts an exemplary in-process wafer assembly having various layers and a patterned material formed thereon, illustrated in vertical section.

One embodiment of an inventive method for improving the accuracy of a contact to an underlying layer comprises the steps as shown in FIGS. 1–4. As shown in FIG. 1, a substrate assembly 10 is formed. In the example of FIG. 1 the substrate assembly comprises field 12 and gate 14 oxide regions formed over a semiconductor substrate 16 such as a silicon wafer, and transistor gates 18 formed over the substrate. A silicide layer 20 and a tetraethyl orthosilicate layer 22 are also shown, along with a blanket insulation layer 24 such as oxide or nitride formed over the transistor gates. Various other substrate assemblies are likely.

Subsequently, a blanket first mask layer 26 such as a planar first photoresist layer is formed over the substrate assembly and a blanket second mask layer 28 is formed over the first photoresist layer. The second mask layer is a layer which can withstand an etch of the first mask (i.e. an etch stop layer) such as a low temperature chemical vapor deposited (CVD) oxide or nitride layer although other materials are possible. The second mask is generally formed at a lower temperature than the bake temperature of the first mask layer to ensure the planar first layer is not disturbed.

Figure 2:
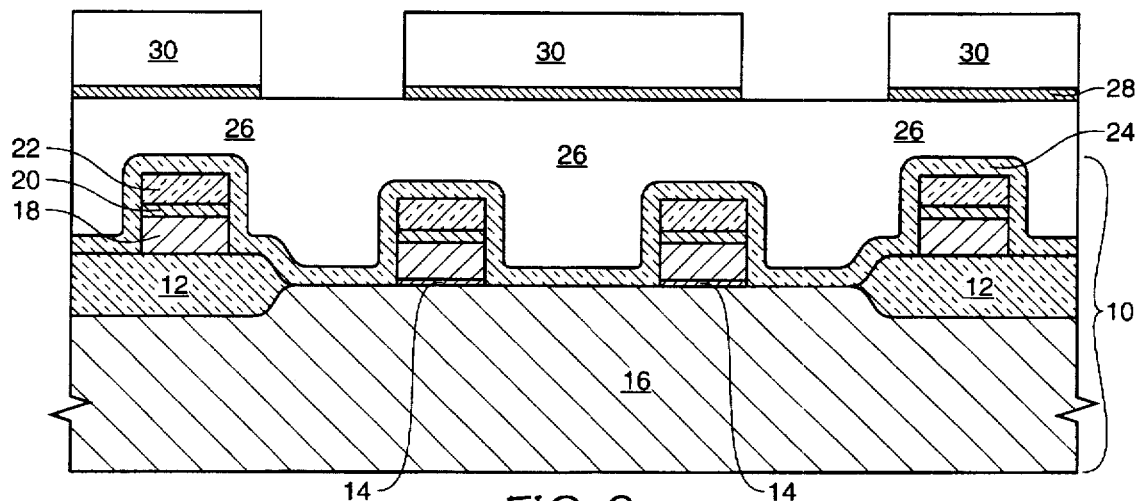
FIG. 2 depicts in vertical section the structure of FIG. 1 after an etch of one mask layer.

Next, a third mask layer 30 such as a planar second photoresist layer is formed over the second mask layer 28. The third mask layer 30 is patterned as shown in FIG. 1, for example using standard photolithography, thereby exposing the second mask layer 28 as shown. If photoresist is used for both the first 26 and third 30 mask layers, the pattern etch of the third mask layer stops on the second mask layer 28. In any case, as shown in FIG. 2, the second mask layer 28 is etched using the third mask layer as a pattern.

Figure 3:
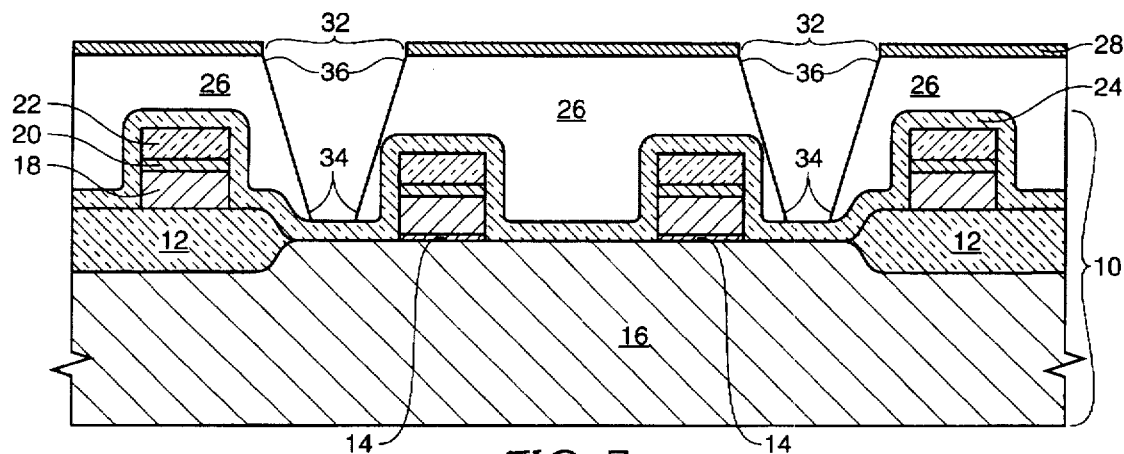
FIG. 3 shows a cross section of the FIG. 2 structure after an etch of another mask layer to form a tapered hole therein.
Figure 4:
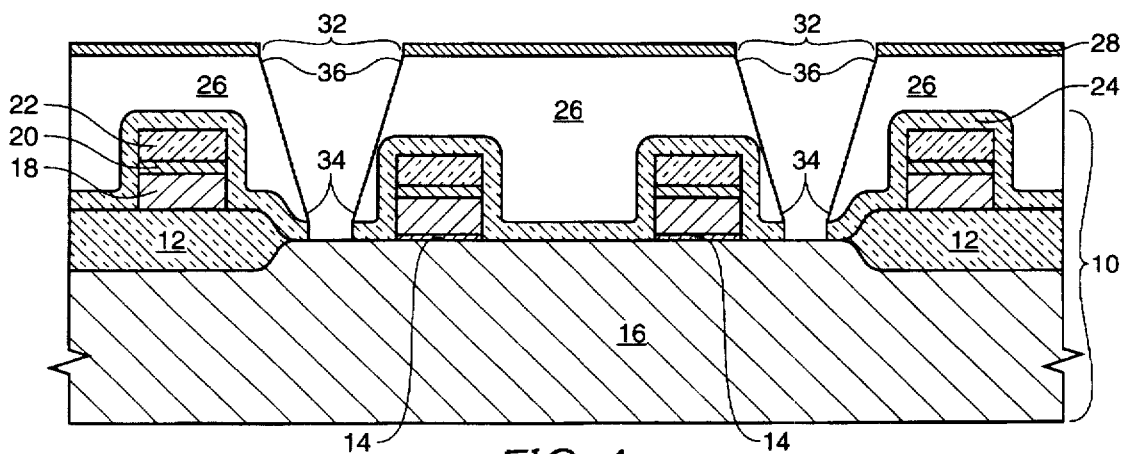
FIG. 4 depicts in vertical section the structure of FIG. 3 after exposing an underlying layer such as a semiconductor substrate.

Subsequently, the first photoresist layer 26 is patterned as shown in FIG. 3 using the patterned second mask layer 28 as a pattern. In this embodiment, an anisotropic prograde etch of the first photoresist layer is used and a tapered hole 32 is formed in the first photoresist layer 26. The taper can be smooth as shown, or the slope may be different at various points along the sidewall of the hole. The first photoresist layer can be etched with a dry etch having an etchant such as $N_2/O_2$, with an optimized nitrogen to oxygen ratio to produce a sloped prograde profile, i.e. a nonvertical slope. For example, using a low pressure inductively coupled plasma system and a 75%/25% ratio of $N_2$ to $O_2$, a slight slope of 88° was achieved. Increasing the amount of $N_2$ increases the slope. Other possible etchants include $O_2/HBr$, $O_2/SO_2$, and $O_2/Ar$, although other etchants may function sufficiently. The tapered hole has a bottom 34 proximal the underlying layer 16 and a top 36 distal the underlying layer 16. As shown in FIG. 3 the top of the hole is significantly wider than the bottom, for example at least 1.5 times wider than the bottom. The insulation layer 24 is then removed to expose the underlying layer 16 as shown in FIG. 4, for example at active areas of the substrate. Finally, the three mask layers are removed and wafer processing continues.

The ratio of the width of the top of the hole to the bottom of the hole (top:bottom) depends on various parameters. For example, the more sloped the etch the greater the ratio. Further, a thicker first photoresist layer will provide an increased top:bottom ratio. A first photoresist thickness of between about 5,000 angstroms (5K Å) and about 20K Å would be sufficient, although other thicknesses could conceivably be used depending on the process.

The inventive method allows for improved accuracy of contact formation, and also extends the useful life of photolithography equipment. For example, with a top:bottom ratio of 5:1, a 0.5 µm diameter contact to the top resist layer forms a contact with a 0.1 µm diameter at the bottom.

Any number of top:bottom ratios are possible. A ratio of between about 1.5:1 and about 5:1, for example about 3:1 would be sufficient. With current and near-future processes, a top hole having a width of between about 0.25 microns and about 1.0 microns, and the bottom having a width of between about 0.05 microns and about 0.3 microns may be useful.

Pressure, temperature, and power are important in determining etch rate, selectivity of resist to oxide, and etch profiles. As pressure increases the etch rate of polymers in oxygen increase due to more reactant being available at higher pressures. To achieve anisotropic etching it is necessary to etch at as low of a pressure as possible. At lower pressure the ions bombarding the substrate suffer fewer collisions in the sheath. This produces a situation where most of the ions arrive at the surface with the full energy associated with the voltage drop from the plasma to the surface. In addition, fewer collisions in the sheath will cause more ions to hit the surface at an angle near 90°. Further, the etch rate of resist increases with temperature. Stripping of resist is commonly carried out at as high of a temperature as possible without decomposing the resist. The dependence of the etch rate on temperature suggests a thermally activated process where, at higher temperatures, the spontaneous chemical etch rate of polymers increases. The higher spontaneous etch rate would coincide with a faster lateral etch rate (undercutting of the masking layer) which would result in critical dimension loss. Finally, the etch rate of polymers increases with power. Higher powers lead to more dissociation and ionization in the plasma. Higher dissociation levels have more atomic oxygen (oxygen radicals) which is the primary species that produces spontaneous chemical etching. Higher ionization levels also lead to an increase in etch rate due to a higher ion flux onto the surface. However, higher powers at the electrode with the wafer lead to lower resist:oxide selectivity, because the higher ion flux and higher ion bombardment energy have a larger effect on the sputtering rate of oxide than on the etch rate of polymer.

The following table summarizes the ideal settings for pressure, power, and temperature as they relate to etch rates, anisotropic profiles, and resist:oxide selectivity:

|  | Pressure | Power | Temperature |
| --- | --- | --- | --- |
| Etch Rate | High | High | High |
| Anisotropy | Low | High | Low |
| Resist:Oxide | High | Low | High |

Optimum conditions for anisotropic profiles are low pressure, high power, and low temperature. Unfortunately, low pressure and low temperature produce low etch rates while low pressure and high power decrease resist:oxide selectivity. In fact, no parameter has an ideal setting which satisfies all three criteria of high etch rate, anisotropic profiles, and good resist:oxide selectivity. This indicates that a different strategy which employs a sidewall protection mechanism, may be required. A sidewall protection mechanism could allow higher temperature processing without sacrificing anisotropic profiles.

Etching resist with $O_2$ and $SO_2$ has been studied (see M. Pons et al., Jpn. J. Appl. Phys. part 1, 33 (2), 991, 1994, and O. Joubert et al. SPIE, vol 1803, 130 (1992) each incorporated herein by reference). It was found that the lateral etch rate of the resist decreased with increasing $SO_2$, with the lateral etch rate reaching a minimum at 80% $SO_2$. The lateral etch rate in a 20% $O_2$/80% $SO_2$ plasma is 15 nanometers/minute (nm/min.), as compared to 110 nm/min. in a pure $O_2$ plasma under the same conditions. The vertical etch rate of the resist also decreases with $SO_2$ addition. Under identical plasma operating conditions, the vertical etch rate in a 20% $O_2$/80% $SO_2$ plasma is 210 nm/min., as compared to 380 nm/min. in a pure $O_2$ plasma. Fortunately, the decrease in lateral etch rate is more significant than the decrease in vertical etch rate. This produces more anisotropic profiles with better critical dimension control when $SO_2$ is added.

Further, when ion energy is varied from 20 eV to 120 eV, no lateral etching is observed at ion energies greater than 90 eV. At all energies investigated, the lateral etch rate in $O_2/SO_2$ was at least five times smaller than the lateral etch rate in pure $O_2$. In this case it appears that there are two factors which control the lateral etch rate, namely passivation of the sidewalls by sulfur and ion energy.

An in-process semiconductor wafer using an embodiment of the inventive process would comprise a first mask layer, for example the photoresist layer 26 shown in FIG. 4 and a second mask layer, such as the CVD oxide or nitride 28. The first and second mask layers comprise apertures therein which define a single etch opening to a layer underlying the first mask layer, such as layer 16.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, any number of top:bottom ratios may prove useful, as well as any sized openings in any of the mask layers. Further, various processes can be used to isotropically and anisotropically etch the different layers. It is therefore contemplated that the appended claims will cover any such modifications or embodiments as fall within the true scope of the invention.

What is claimed is:

1. A method for forming a semiconductor device comprising the following steps:

providing a first substrate assembly layer and a second substrate assembly layer overlying said first substrate assembly layer;

forming a first mask layer over said second substrate assembly layer;

forming a patterned second mask layer over said first mask layer;

etching said first mask layer using said second mask layer as a pattern thereby exposing said second substrate assembly layer, said first mask layer having a tapered profile;

etching said second substrate assembly layer using said first mask layer as a pattern, thereby exposing said first substrate assembly layer; and removing said first and second mask layers.

2. The method of claim 1 wherein said first mask layer comprises photoresist and said second mask layer comprises a material selected from the group consisting of oxide and nitride.

3. The method of claim 2 wherein said first substrate assembly layer is a semiconductor substrate and said second substrate assembly layer comprises oxide.

4. The method of claim 1 wherein said first mask layer comprises photoresist and said step of forming a patterned second mask layer comprises the following steps:

forming a third mask layer comprising photoresist over said second mask layer;

etching said second mask layer using said third mask layer as a pattern, thereby patterning said second mask layer to form said patterned second mask layer.

5. The method of claim 4 further comprising the step of removing said third mask layer during said step of etching said first mask layer.

6. The method of claim 1 wherein said first mask layer has an opening therein which forms said tapered profile of said first mask layer, and a ratio of a top of said opening to a bottom of said opening is in the range of about 1.5:1 to about 5:1.

7. A method of forming a semiconductor device comprising the following steps:

providing a first substrate assembly layer and a second substrate assembly layer overlying said first substrate assembly layer;

providing a first mask layer overlying said second substrate assembly layer, a second mask layer overlying said first mask layer, and a patterned third mask layer having a hole therein with a substantially vertical profile overlying said second mask layer;

subsequent to providing said first, second, and third mask layers, patterning said second mask layer using said patterned third mask as a pattern;

subsequent to patterning said second mask layer, patterning said first mask layer using said second mask layer as a pattern thereby forming a hole in said first mask layer, wherein said hole in said first mask layer has a tapered profile;

etching said second substrate assembly layer using said first mask layer as a pattern.

8. The method of claim 7 further comprising the step of removing said third mask layer.

9. The method of claim 7 further comprising the step of removing said first, second, and third mask layers.

10. The method of claim 7 further wherein said third mask layer is removed during said step of patterning said first mask layer.

11. The method of claim 7 wherein said third mask layer contacts said second mask layer and said second mask layer contacts said first mask layer.

12. A method of decreasing a feature size which can be produced by photolithography equipment, comprising the following steps:

using a photolithographic mask or reticle, forming a pattern on a first photoresist layer, said pattern comprising at least one opening in said first photoresist layer, said opening having a first width;

forming an opening in a mask layer underlying said first photoresist layer using said first photoresist layer as a pattern;

forming a tapered opening in a second photoresist layer underlying said mask layer using said opening in said mask layer as a pattern, said tapered opening having a top toward said mask layer and a bottom, wherein a second width at said bottom of said tapered opening is narrower than said first width of said opening in said first photoresist layer.

13. The method of claim 12 further comprising the step of removing said first photoresist layer, said mask layer, and said second photoresist layer.

14. The method of claim 13 wherein said first photoresist layer directly contacts said mask layer.

15. The method of claim 14 wherein said mask layer directly contacts said second photoresist layer.

16. The method of claim 12 wherein a ratio of said width at said top of said second photoresist layer to said width at said bottom of said second photoresist layer is between about 1.5:1 and about 5:1.

17. A method used during the formation of a semiconductor device comprising the following steps:

forming a first photoresist layer, a mask layer over said first photoresist layer, and a second photoresist layer over said mask layer and over said first photoresist layer, said first photoresist layer having a top near said mask layer and a bottom away from said mask layer;

using said mask layer as a pattern, etching said first photoresist to form a tapered hole therein, said tapered hole having a first width at said top and a second width narrower than said first width at said bottom.

18. The method of claim 17 wherein a ratio of said first width to said second width is between about 1.5:1 and about 5:1.

19. The method of claim 17 further comprising the following steps:

etching a portion of a dielectric layer underlying said first photoresist layer using said first photoresist layer as a pattern;

subsequent to said step of etching said dielectric layer, removing said first photoresist layer.

20. The method of claim 17 further comprising the step of removing said second photoresist layer simultaneously with said step of etching said tapered hole.

* * * * *